US010312367B2

(12) United States Patent
Phoa et al.

(10) Patent No.: US 10,312,367 B2
(45) Date of Patent: Jun. 4, 2019

(54) MONOLITHIC INTEGRATION OF HIGH VOLTAGE TRANSISTORS AND LOW VOLTAGE NON-PLANAR TRANSISTORS

(71) Applicant: Intel Corporation, Santa Clara, CA (US)

(72) Inventors: Kinyip Phoa, Beaverton, OR (US); Nidhi Nidhi, Hillsboro, OR (US); Chia-Hong Jan, Portland, OR (US); Ting Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 15/301,282

(22) PCT Filed: Jun. 20, 2014

(86) PCT No.: PCT/US2014/043370
§ 371 (c)(1),
(2) Date: Sep. 30, 2016

(87) PCT Pub. No.: WO2015/195134
PCT Pub. Date: Dec. 23, 2015

(65) Prior Publication Data
US 2017/0025533 A1    Jan. 26, 2017

(51) Int. Cl.
H01L 29/78        (2006.01)
H01L 29/66        (2006.01)
(Continued)

(52) U.S. Cl.
CPC .. H01L 29/7834 (2013.01); H01L 21/823412 (2013.01); H01L 21/823418 (2013.01);
(Continued)

(58) Field of Classification Search
None
See application file for complete search history.

(56) References Cited

U.S. PATENT DOCUMENTS 4,855,620 A    8/1989  Duvvury et al.
6,417,553 B1   7/2002  Chou et al.
(Continued)

FOREIGN PATENT DOCUMENTS

JP    2008270575    11/2008
JP    2013518491    5/2013
WO    2007063908    6/2007

OTHER PUBLICATIONS

International Search Report and Written Opinion for International Patent Application No. PCT/US2014/043370, dated Mar. 18, 2015.
(Continued)

Primary Examiner — Ratisha Mehta
(74) Attorney, Agent, or Firm — Green, Howard & Mughal LLP

(57) ABSTRACT

High voltage transistors spanning multiple non-planar semiconductor bodies, such as fins or nanowires, are monolithically integrated with non-planar transistors utilizing an individual non-planar semiconductor body. The non-planar FETs may be utilized for low voltage CMOS logic circuitry within an IC, while high voltage transistors may be utilized for high voltage circuitry within the IC. A gate stack may be disposed over a high voltage channel region separating a pair of fins with each of the fins serving as part of a source/drain for the high voltage device. The high voltage channel region may be a planar length of substrate recessed relative to the fins. A high voltage gate stack may use an isolation dielectric that surrounds the fins as a thick gate dielectric. A high voltage transistor may include a pair of doped wells formed into the substrate that are separated by the high voltage gate stack with one or more fin encompassed within each well.

10 Claims, 9 Drawing Sheets

(51) Int. Cl.
  *H01L 29/06*     (2006.01)
  *H01L 29/08*     (2006.01)
  *H01L 21/8234*   (2006.01)
  *H01L 27/092*    (2006.01)

(52) U.S. Cl.
  CPC .. *H01L 21/823456* (2013.01); *H01L 27/0922* (2013.01); *H01L 29/0684* (2013.01); *H01L 29/0847* (2013.01); *H01L 29/66621* (2013.01); *H01L 29/7835* (2013.01); *H01L 27/0924* (2013.01)

(56) References Cited

U.S. PATENT DOCUMENTS

| | | |
|---|---|---|
| 7,326,634 B2 | 2/2008 | Lindert et al. |
| 2004/0198009 A1 | 10/2004 | Chen et al. |
| 2005/0056888 A1 | 3/2005 | Youn et al. |
| 2006/0131656 A1 | 6/2006 | Shin et al. |
| 2007/0052027 A1 | 3/2007 | Ke et al. |
| 2007/0069293 A1 | 3/2007 | Kavalieros |
| 2008/0277723 A1 | 11/2008 | Fukui et al. |
| 2010/0065823 A1* | 3/2010 | Edwards ............. H01L 27/0629 257/24 |
| 2011/0298041 A1 | 12/2011 | Renn |
| 2012/0025316 A1 | 2/2012 | Schultz |
| 2012/0261726 A1 | 10/2012 | Yang et al. |
| 2013/0240989 A1 | 9/2013 | Glass et al. |
| 2014/0103450 A1 | 4/2014 | Cheng |
| 2014/0377922 A1 | 12/2014 | Fung |
| 2015/0014788 A1* | 1/2015 | Park .................. H01L 29/66545 257/401 |

OTHER PUBLICATIONS

Office Action dated Jul. 29, 2016, for TW Patent Application No. 104115263.
Extended European search Report for European Patent Application No. 14895422.5, dated Dec. 19, 2017.
International Preliminary Report on Patentability for PCT/US2014/043370 dated Dec. 29, 2016, 9 pages.
Reason for Refusal for Japan Patent Application No. 2016-567070, dated Mar. 27, 2018.
Notice of Allowance for Taiwan Patent Application No. 104115263, dated Jun. 29, 2017.

* cited by examiner

MONOLITHIC INTEGRATION OF HIGH VOLTAGE TRANSISTORS AND LOW VOLTAGE NON-PLANAR TRANSISTORS

CLAIM OF PRIORITY

This application is a National Phase Application of, and claims priority to, International Patent Application No. PCT/US2014/043370entitled "MONOLITHIC INTEGRATION OF HIGH VOLTAGE TRANSISTORS & LOW VOLTAGE NON-PLANAR TRANSISTORS," filed Jun. 20, 2014, the entire contents of which are incorporated by reference in its entirety.

TECHNICAL FIELD

Embodiments of the invention generally relate to fabrication of monolithic integrated circuits (ICs), and more particularly pertain to high voltage transistor structures compatible with non-planar high-performance low-voltage (logic) transistor structures.

BACKGROUND

Monolithic ICs generally comprise vast number of active devices, such as metal-oxide-semiconductor field-effect transistors (MOSFETs), or the like, and passive devices, such as resistors, etc., fabricated over a substrate. Current system on chip (SoC) technologies are focused on aggressively scaling the FET gate length ($L_g$) to provide performance and area scaling in accordance with Moore's Law.

Low leakage and/or high voltage transistors are important in SoC applications, but become more difficult with lateral scaling due, at least in part, to the architecture of high voltage transistors diverging from that of the high-performance logic transistor. Lateral scaling also reduces gate-contact spacing, which increases the peak electric field, further reducing a transistor's high voltage operating window. Also, lateral scaling exacerbates the hot carrier effect, which is a major limiter for high voltage transistors. To date, this incompatibility with advanced CMOS architecture and high voltage transistor architecture has motivated off-chip solutions, which are expensive and suffer performance limitations.

A device architecture enabling a non-planar transistor, such as a finFET, to be monolithically integrated with transistors able to have a gate dielectric with significantly greater equivalent oxide thickness (EOT) and a larger gate-drain spacing is advantageous for complex monolithic SOC IC designs employing power management circuitry, charge pump devices, RF power amplification circuitry, etc. that need transistors which can withstand higher breakdown voltages than needed for logic circuitry.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
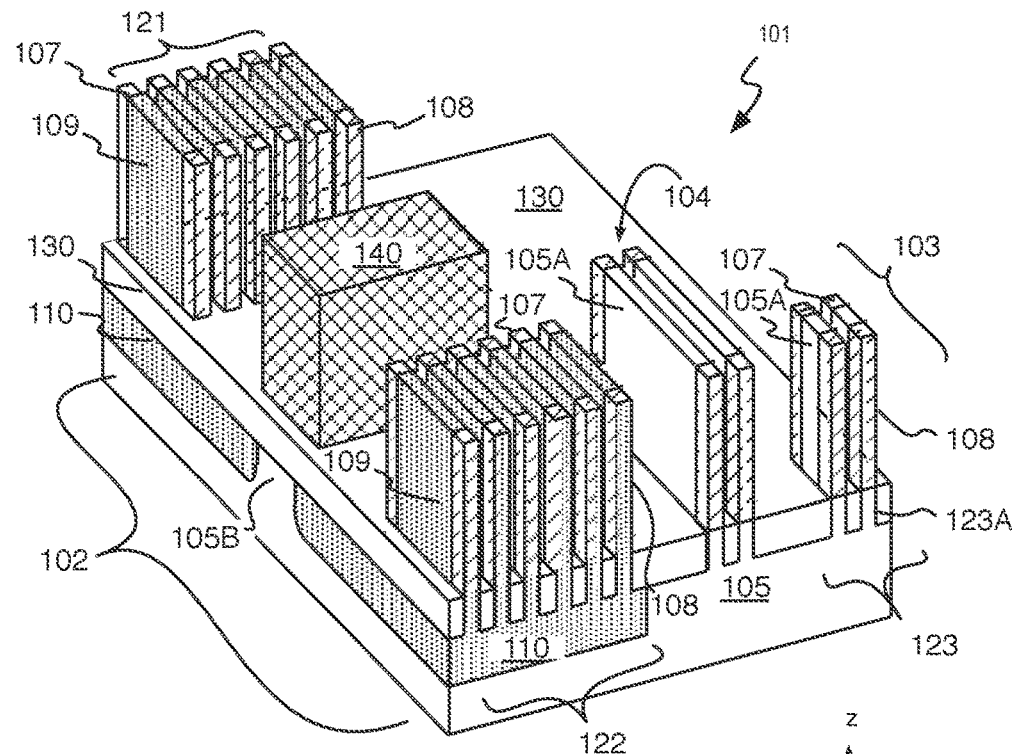
FIG. 1A is an isometric view of an IC structure including a high voltage transistor monolithically integrated with finFETs, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or to "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistors suitable for high voltage operation, referred to herein as "high voltage transistors," spanning multiple non-planar semiconductor bodies are monolithically integrated with low voltage transistors utilizing an individual non-planar semiconductor body. Each non-planar semiconductor body may be of any architecture having multiple gated surfaces (e.g., bi-gate, tri-gate, omega-gate, wrap-around gate, etc.), referred to herein generically as a "fin." A finFET may be utilized for high-performance low-voltage CMOS logic circuitry within an IC, while the high voltage transistors having hybrid planar-fin architecture may be utilized for high voltage circuitry within the IC. In embodiments, a high voltage transistor includes a gate stack disposed over a planar channel region separating a pair of non-planar semiconductor bodies. Each of the non-planar bodies serves as part of a source or drain for the high voltage device. In embodiments, the high voltage channel region is a planar length of substrate recessed relative to the non-planar bodes. A top of the high voltage gate stack may be substantially planar with a top of a finFET gate stack that is disposed over another non-planar semiconductor body. In further embodiments, a high voltage gate stack utilizes an isolation dielectric that surrounds the non-planar semiconductor bodies as a thick gate dielectric suitable for large gate voltages (e.g., >3V) and gate-drain breakdowns of by, or more. In embodiments, a high voltage transistor includes a pair of doped wells formed into the substrate that are separated by the high voltage gate stack. One or more semiconductor body is encompassed within each doped well, and has the same conductivity type as the doped well. High voltage devices may further include doped well tips adjacent to the gate stack. Wells, semiconductor bodies, and channel regions may be doped to complementary conductivity types, and high voltage gate electrodes may be doped to have a desired work function for high voltage and/or high voltage CMOS implementations. In further embodiments, a finFET gate stack operable for controlling conductance of the finFET at low gate voltages (e.g., <2V) is also disposed over semiconductor bodies of the high voltage transistor as a dummy gate stack. Contact metallization disposed on opposite sides of the dummy gate stacks may be interconnected in electrical parallel as bifurcated source/drain contacts that are electrically coupled to one of the doped wells within the substrate.

Figure 1B:
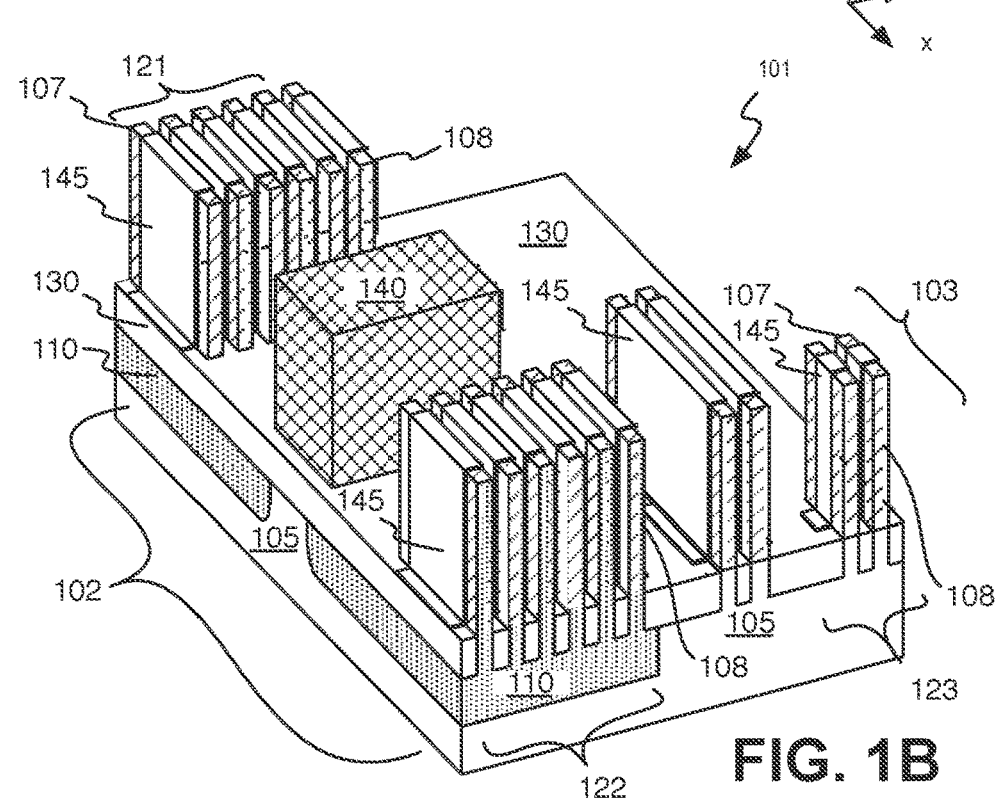
FIGS. 1B and 1C are isometric views of a portion of the IC structure illustrated in FIG. 1A with layers of the finFET gate stack removed to further illustrate non-planar semiconductor bodies of a high voltage transistor in accordance with embodiments.
Figure 1C:
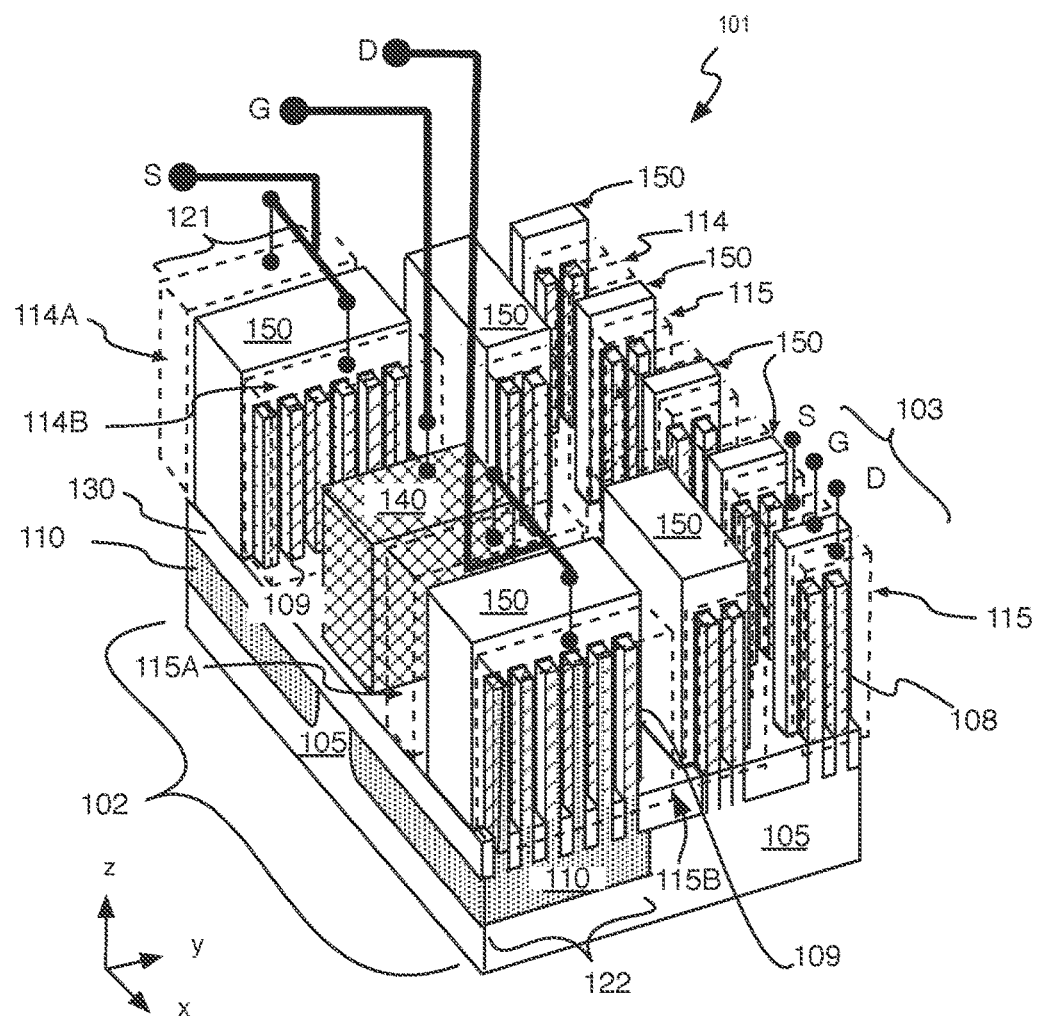

In embodiments, an IC structure includes a high voltage FET disposed over a first region of the substrate. FIG. 1A is an isometric view of an IC structure 101 including a high voltage FET 102 monolithically integrated with a finFET 103 in accordance with an embodiment. FIG. 1B is an isometric view of the IC structure 101 depicting a gate dielectric of finFET 103 to further illustrate the integration of high voltage transistor 102 with finFET 103, in accordance with embodiments. FIG. 1C is an isometric view of the IC structure 101 with contact metal and layers of the finFET gate stack added to further illustrate the integration of high voltage transistor 102 with finFET 103, in accordance with embodiments.

Referring first to FIG. 1A, IC high voltage FET 102 includes a pair of non-planar semiconductor bodies, referred to herein as "fins" 121 and 122 disposed over a substrate 105. Fins 121 and 122 may take a variety of forms, such as, but not limited to, bi-gate, tri-gate, omega-gate, wrap-around gate (i.e., nanowires). While the exemplary high voltage FET 102 includes a first plurality of fins 121 and a second plurality of fins 122, a pair of single fin structures may be utilized in other embodiments. Substrate 105 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof In one exemplary embodiment, substrate 105 comprises a substantially monocrystalline semiconductor, such as, but not limited to, silicon. Exemplary semiconductor substrate compositions also include germanium, or group IV alloy systems, such as SiGe; group systems, such as GaAs, InP, InGaAs, and the like; or group III-N systems, such as GaN. The pair of non-planar semiconductor bodies 121 and 122 may be of the same substantially monocrystalline semiconductor as substrate 105 (e.g., silicon). Substrate 105 may be substantially undoped (i.e., not intentionally doped). However, in the exemplary embodiment, substrate 105 has a nominal doping level of a certain conductivity type (e.g., p-type) in first regions and a nominal doping level of the complementary conductivity type (e.g., n-type) in second regions. In the embodiment illustrated in FIG. 1A, the portion of substrate 105 depicted has one conductivity type (e.g., p-type). An analogous structure adjacent to the region illustrated in FIG. 1A may be of the complementary type (e.g. n-type), facilitating a high voltage transistor and a finFET having substantially the same architecture but of complementary type for CMOS implementation.

As further illustrated in FIG. 1A, finFET 103 also includes one or more non-planar semiconductor body 123. Non-planar semiconductor body 123 may be of the same substantially monocrystalline semiconductor as substrate 105 (e.g., silicon). The non-planar semiconductor bodies 121, 122, and 123 may extend from a substantially planar top surface of an isolation dielectric 130 by same or differing z-heights. In the exemplary embodiment, non-planar semiconductor bodies 121, 122, and 123 all have substantially the same z-height ranging, for example, between 10 nm and 200 nm above isolation dielectric 130. Isolation dielectric 130 may be any dielectric(s), such as, but not limited to, silicon oxides ($SiO_2$), silicon oxynitrides (SiON), silicon nitrides (SiN), silicon carbonitrides (SiCN), or a low-k dielectric such as carbon-doped oxide (SiOC), or the like. Isolation dielectric 130 may have a wide range of thickness. In one exemplary embodiment, isolation dielectric 130 may between 50 nm and 100 nm. As shown along one section in FIG. 1A, semiconductor bodies 121, 122, and 123 extend through isolation dielectric 130 (i.e., isolation dielectric 130 surrounds semiconductor bodies 121, 122, and 123) down to a surface of substrate 105 that extends under isolation dielectric 130 and joins the bodies 121, 122, and 123.

For finFET 103, each non-planar semiconductor body 123 includes a source region 107 at a first end and a drain region 108 at a second end. Depending on the conductivity type of the transistor, source and drain regions 107, 108 may be doped either n-type (e.g., NMOS) or p-type (e.g., PMOS). In certain embodiments, source and drain regions 107, 108 may be heavily doped portions of a semiconductor body, or may be raised, or embedded heavily doped semiconductor regrown upon portions of the semiconductor body extending above isolation dielectric 130. As illustrated in one of the sections in FIG. 1A, semiconductor body portion 123A that extends through isolation 130 may have the complementary doping type and/or nominal impurity level of substrate 105. Source/drain regions 107, 108 are separated by a channel region 105A of the non-planar semiconductor body having the nominal substrate composition and/or doping. In one exemplary embodiment, at least channel region 105A may be substantially undoped (e.g., not intentionally doped), or may be lightly doped, to have a conductivity type complementary to source/drain regions 107, 108 (e.g., p-type channel region for an NMOS FET, n-type channel region for a PMOS FET). Noting the length of the channel region of a finFET may be varied, another finFET 104 having a channel region 105A of longer length than that of finFET 103 is further illustrated in FIG. 1A.

For high voltage FET 102, each of the pair of semiconductor bodies 121, 122 extend from a doped well 110 disposed within substrate 105. Doped wells 110 may extend from an interface with isolation dielectric 130 into substrate 105 over a wide range of depths. In one exemplary embodiment, doped wells 110 extend 10-50 nm below isolation dielectric 130 with a nominally doped portion of substrate 105 surrounding each of the pair of doped wells 110. Doped wells 110 may have any doping level as a function of impurity solubility, etc. with one exemplary embodiment being doped to between $10^{16}$ $cm^{-3}$ and $10^{20}$ $cm^{-3}$. High voltage FET 102 includes a channel region 105B, which is a portion of substrate 105, separating the pair of doped wells 110. In the exemplary embodiment, channel region 105B is disposed below isolation dielectric 130 and is a planar portion of substrate 105 from which the non-planar semiconductor bodies 121, 122 extend. Channel region 105B may therefore have the nominal doping level of substrate 105 (e.g., p-type), in which case the pair of doped wells 110 are both n-type. An alternate embodiment has complementary doping, and a further embodiment includes a plurality of high voltage FETs 102, some of which have p-type channel regions 105B and n-type wells 110, and others of which have n-type channel regions 105B and p-type wells 110 for CMOS implementation.

Unlike non-planar semiconductor body 123 in finFET 103, each of the semiconductor bodies 121, 122 employed in high voltage FET 102 is doped to the same conductivity type as that of doped wells 110. Semiconductor bodies 121, 122 are of a single conductivity type rather than having complementarily doped channel and source/drain portions. As such, semiconductor bodies 121, 122 include a nominally doped region 109, which may have the substantially the same impurity concentration as that of doped well 110. More heavily doped semiconductor source/drain regions 107, 108 are on either side of nominally doped region 109. Just as was described for semiconductor body 123, source/drain regions 107, 108 may be raised or embedded semiconductor regrowths, etc. The entire length of semiconductor body 121 and semiconductor body 122 therefore serves as a single conductor with the source/drain regions 107, 108 providing a pair of contact lands to each conductive semiconductor body. As shown in FIG. 1A, well doping is present in the semiconductor body portions extending through isolation dielectric 130, electrically connecting each of the pair of semiconductor bodies 121, 122 to a corresponding one of doped wells 110. Heavily-doped source/drain regions 107, 108 therefore provide a pair of contact lands electrically coupled to each one of the pair of doped wells 110.

A high voltage gate stack is disposed over the channel region of a high voltage FET. In embodiments, a high voltage gate stack includes a gate dielectric that is of a different EOT than that of a finFET gate stack. To achieve a difference in EOT between a high voltage FET and a finFET, either or both material composition and film thickness may be varied independently of that of a short channel device. In embodiments, a high voltage gate dielectric comprises the isolation dielectric that is also disposed around non-planar semiconductor bodies. For example, as illustrated in FIG. 1A, isolation dielectric 130 is disposed over channel region 105B with a high voltage gate electrode 140 disposed over (e.g., directly on) isolation dielectric 130. As noted above, isolation dielectric 130 may have a nominal thickness of, for example 50-100 nm where it surrounds semiconductor bodies 121, 122. In the illustrative embodiment, isolation dielectric 130 has this same thickness over channel region 150B. In other embodiments, isolation dielectric 130 may be thinner over channel region 150B than where it surrounds semiconductor bodies 121, 122. In advantageous embodiments, high voltage gate dielectric is of a material having a lower dielectric constant than that of a gate dielectric for a finFET. Lower relative permittivity may reduce the field effect of high voltage gate electrode 140 at any given gate voltage, enabling higher voltage operation. In certain embodiments, the high voltage gate dielectric is of a material having a lower dielectric constant than that of a finFET gate dielectric. In advantageous embodiments, where isolation dielectric 130 is employed as the high voltage gate dielectric, the bulk dielectric constant (i.e., relative permittivity) is less than 8, and more advantageously less than 4. In the illustration embodiment therefore, the high voltage gate dielectric has both a relatively low bulk relative permittivity (e.g., less than 8) and a relatively large film thickness (e.g., 50-100 nm).

High voltage gate electrode 140 may include any material having a suitable work function. Exemplary materials include polycrystalline semiconductor (e.g., polysilicon) doped to a desired conductivity type (e.g., n-type for an NMOS high voltage transistor 102, or p-type for a PMOS high voltage transistor 102). Polysilicon has further advantages where an IC structure further includes a thin film resistor (not depicted), which may be of the same polysilicon, which may be doped to a desired sheet resistance. For such an embodiment, high voltage gate electrode 140 and a polysilicon resistor may be essentially the same, with the former merely properly aligned with channel region 105B to induce inversion when biased through an interconnect. In alternative embodiments, high voltage gate electrode 140 may include one or more metals (i.e., alloys). Regardless of composition, in certain embodiments, a top surface of high voltage gate electrode 140 extends a z-height from isolation dielectric 130 that is greater than the z-heights of non-planar semiconductor bodies 121, 122. As the doped wells 110 may be made arbitrarily large, so too may the gate to drain spacing. Likewise, lateral dimensions of gate electrode 140 and channel region 150B may be arbitrarily wide, for example 100-1000 nm, or more. These geometries along with arbitrarily thick gate dielectric, allow high voltage transistor 102 to have any desired high voltage operating point (e.g., with gate-drain breakdown voltage exceeding 10V) while remaining completely compatible with a minimum design rule finFET 103 that has a low voltage operating point (e.g., gate-drain breakdown voltage well below 5V).

In embodiments, a high voltage FET further comprises a pair of dummy gate stacks. Dummy gate stacks may be formed on non-planar semiconductor body portions of a high voltage FET as an artifact of fabricating the gate stack of a finFET disposed on the same substrate. In embodiments therefore, the dummy gate stack present on a region of a high voltage FET is substantially the same as a functional gate stack disposed on a finFET. FIG. 1B is an isometric view of the IC structure 101 depicting a finFET gate dielectric 145 disposed over the channel region 105A of semiconductor bodies 123. FinFET gate dielectric 145 may be any dielectric known to be suitable for a finFET, such as, but not limited to, high-k material (e.g., having a bulk dielectric constant of 10 or more), as well mid-k materials like SiO, SiON, SiN. In one advantageous embodiment where isolation dielectric 130 further serves as a high voltage gate dielectric, finFET gate dielectric 145 has a higher bulk relative permittivity than that of high voltage gate dielectric (i.e., isolation dielectric 130). As illustrated, finFET gate dielectric 145 is further disposed over nominally doped region 109 of semiconductor bodies 121 and 122 as one layer of a dummy gate stack.

FIG. 1C is an isometric view of the IC structure 101 further illustrating short channel gate electrode 150 disposed over finFET gate dielectric 145 to complete the finFET gate stack for finFET 103. FinFET gate electrode 150 may be any material known to be suitable for a finFET, such as, but not limited to a metal with a desired workfunction relative to the channel region 105A (e.g., a midgap, n-type, or p-type material) or a polycrystalline semiconductor (e.g., polysilicon) doped to a desired workfunction relative to the channel region 105A. In one advantageous embodiment where high voltage gate electrode 140 is polycrystalline semiconductor, short channel gate electrode 150 comprises one or more metal. As also illustrated in FIG. 1C, a short channel gate electrode 150 is further disposed over finFET gate dielectric 145 covering semiconductor bodies 121 and 122 as another layer in a pair of dummy gate stacks.

In embodiments, a high voltage transistor source terminal includes a pair of contacts and a high voltage transistor drain terminal includes a pair of contacts. As further illustrated with dashed line in FIG. 1C, a first pair of diffusion contacts 114A, 114B land on the pair of source/drain regions 107, 108 of semiconductor bodies 121. Similarly, a second pair of diffusion contacts 115A, 115B land on the pair of source, drain regions 107, 108 of semiconductor bodies 122. As illustrated each of these pairs of diffusion contacts may be connected in electrical parallel, for example through upper level metallization as single source and drain terminals of high voltage transistor 102. FinFET 103 may include analogous source and drain diffusion contacts 114, 115 as FIG. 1C illustrates for a number of finFETs. In advantageous embodiments, diffusion contacts of both high voltage FET 102 and finFET 103 are metallized with a same material(s), such as but not limited to any metal know to form an ohmic junction with source, drain regions 107, 108. In further embodiments diffusion contacts 114, 114A, 114B, 115, 115A, and 115B are all substantially co-planar (i.e., with their top surfaces extending to within 10% of the same z-height from isolation dielectric 130).

Figure 2A:
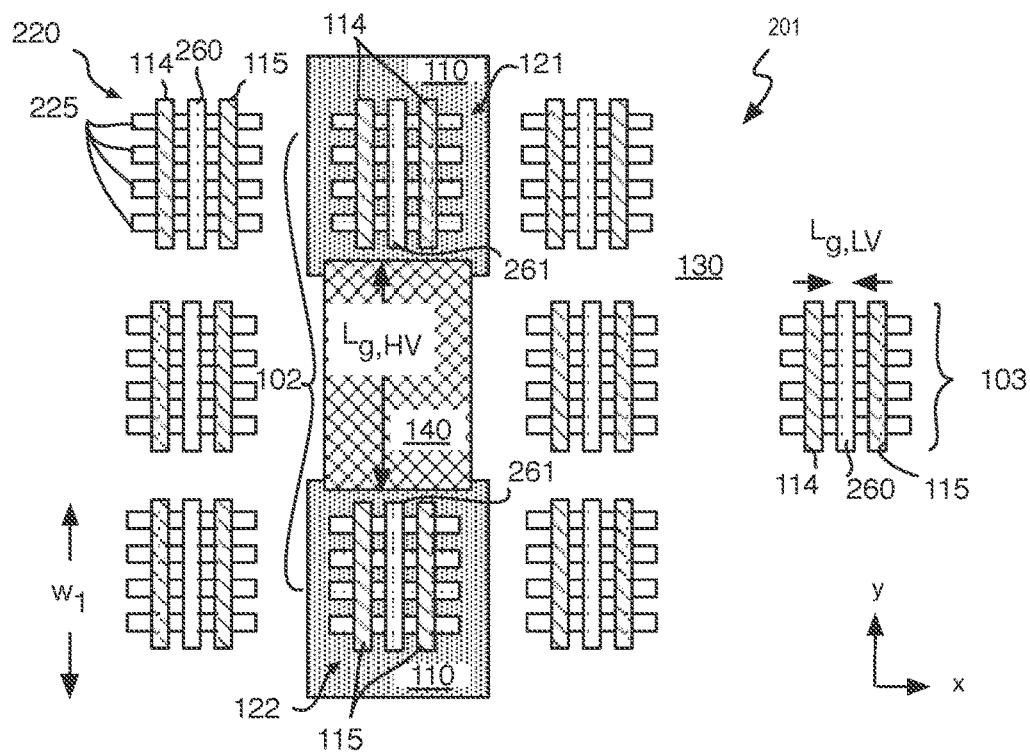
FIGS. 2A, 2B, 2C, and 2D are plan views of a high voltage transistor integrated within an array of non-planar transistor structures in accordance with embodiments.

FIGS. 2A, 2B, 2C and 2D are plan views of a high voltage transistor 102 integrated within an array of non-planar transistor structures in accordance with embodiments. Referring first to FIG. 2A, IC structure 201 includes a plurality of finFET gangs 220 arrayed over a substrate and surrounded by isolation dielectric 130. Each finFET gang 220 includes a plurality of non-planar semiconductor bodies 225 having their longest lengths oriented in parallel to extend along a first dimension (e.g., x-axis). Non-planar semiconductor bodies 225 also have substantially the same orientation across the plurality of finFET gangs 220 (e.g., all parallel to each other). The pair of doped wells 110 is disposed below isolation 130, for example substantially as described above in referenced to FIG. 1A-1C. Doped wells 110 encompass the pair of semiconductor bodies 121, 122 which are part of two separate finFET gangs 220 aligned with each other along the first dimension (e.g., x-axis). Each of the doped wells 110 has a width $w_1$ sized to encompass all non-planar semiconductor bodies of at least one finFET gang 220. High voltage gate electrode 140 is disposed over isolation dielectric 130, for example substantially as described above in referenced to FIG. 1A-1C. A high voltage gate length $L_{g,HV}$ extends in a second, substantially orthogonal, dimension (e.g., along y-axis). Source contact 114 is disposed in, on, or over, semiconductor body 121 and diffusion contact 115 is disposed on in, on, or over, semiconductor body 122, for example substantially as described above in referenced to FIG. 1A-1C, rendering high voltage FET 102 ready for upper-level metal interconnection. In the exemplary embodiment depicted in FIG. 2A, one or more of finFET gangs 220 outside of the pair of doped wells 110 may further include a gate stack 260 disposed over non-planar semiconductor bodies 225. In the exemplary embodiment, a low voltage gate length $L_{g,LV}$ extends in the first dimension (e.g., along x-axis), orthogonal to $L_{g,HV}$. Dummy gate stacks 261, which may be artifacts of fabricating gate stacks 260, may be present as illustrated in FIG. 2A. A source diffusion contact 114 and drain diffusion contact 115 is further disposed on either side of gate stack 250, rendering finFET 103 ready for upper-level metal interconnection.

Figure 2B:
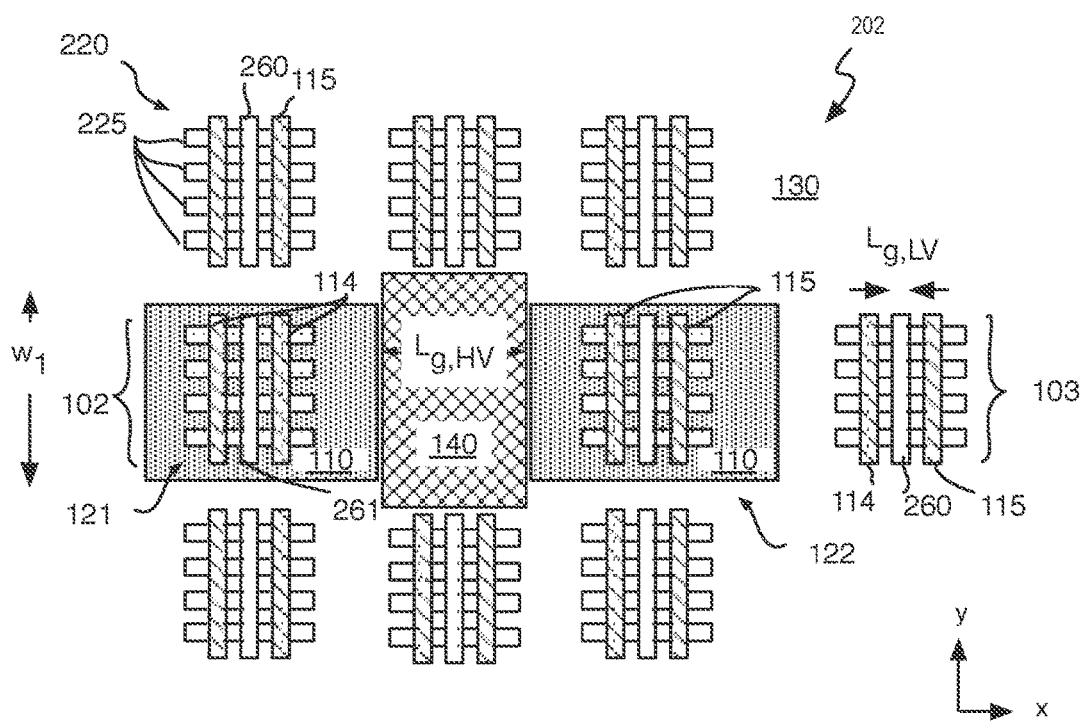

FIG. 2B illustrates IC structure 202 that again includes a plurality of finFET gangs 220 arrayed over a substrate and surrounded by isolation dielectric 130. For IC structure 202, the high voltage and low voltage gate lengths are both in the same dimension (e.g., along the x-axis). Each finFET gang 220 again includes a plurality of non-planar semiconductor bodies 225 having their longest lengths in parallel and oriented to extend along the first dimension (e.g., x-axis). Non-planar semiconductor bodies 225 have substantially the same orientation across the plurality of finFET gangs 220 (e.g., all parallel to each other). Doped wells 110 encompass the pair of semiconductor bodies 121, 122, which are part of two separate finFET gangs 220 aligned with each other along the second dimension (e.g., y-axis). Doped wells have a width $w_1$ sized to encompass all non-planar semiconductor bodies of at least one finFET gang 220. High voltage gate electrode 140 is disposed over isolation dielectric 130, for example substantially as described above in referenced to FIG. 1A-1C. High voltage gate length $L_{g,HV}$ extends in the first dimension (e.g., along x-axis). Source diffusion contact 114 is disposed in, on, or over, semiconductor body 121 and drain diffusion contact 115 is disposed on in, on, or over, semiconductor body 122, for example substantially as described above in referenced to FIG. 1A-1C, rendering high voltage FET 102 ready for upper-level metal interconnection. In the exemplary embodiment depicted in FIG. 2B, one or more of finFET gangs 220 outside of the pair of doped wells 110 may further include a gate stack 260 disposed over non-planar semiconductor bodies 225. In the exemplary embodiment, a short channel gate length $L_{g,LV}$ again extends in the first dimension (e.g., along x-axis), parallel to $L_{g,HV}$. Dummy gate stacks 261 may be present as illustrated in FIG. 2B, which may be artifacts of fabricating gate stacks 260. A source diffusion contact 114 and drain diffusion contact 115 is further disposed on either side of gate stack 250, rendering finFET 103 ready for upper-level metal interconnection.

Figure 2C:
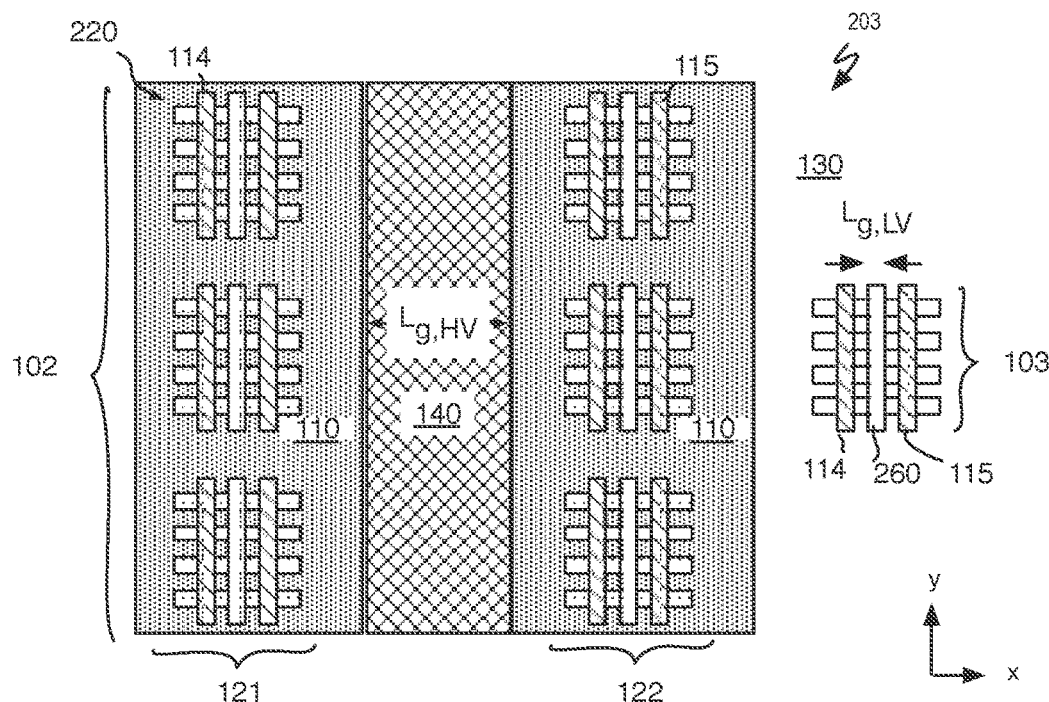

FIG. 2C illustrates an IC structure 203 where doped wells extend over more than one pair of ganged finFETs, for example for greater drive current levels at a high voltage operating point. In this exemplary embodiment, each of the pair doped wells 110 extends over three finFET gangs 220 with gate electrode 140 disposed between widths of doped wells 110 to control a semiconductor channel region below isolation dielectric 130. FinFET 103 may again be fabricated in a second region of a substrate, beyond the pair of doped wells 110. Any of the other features described in the context of FIGS. 2A and 2B may be directly applied to the up-scaled high voltage FET 102.

Figure 2D:
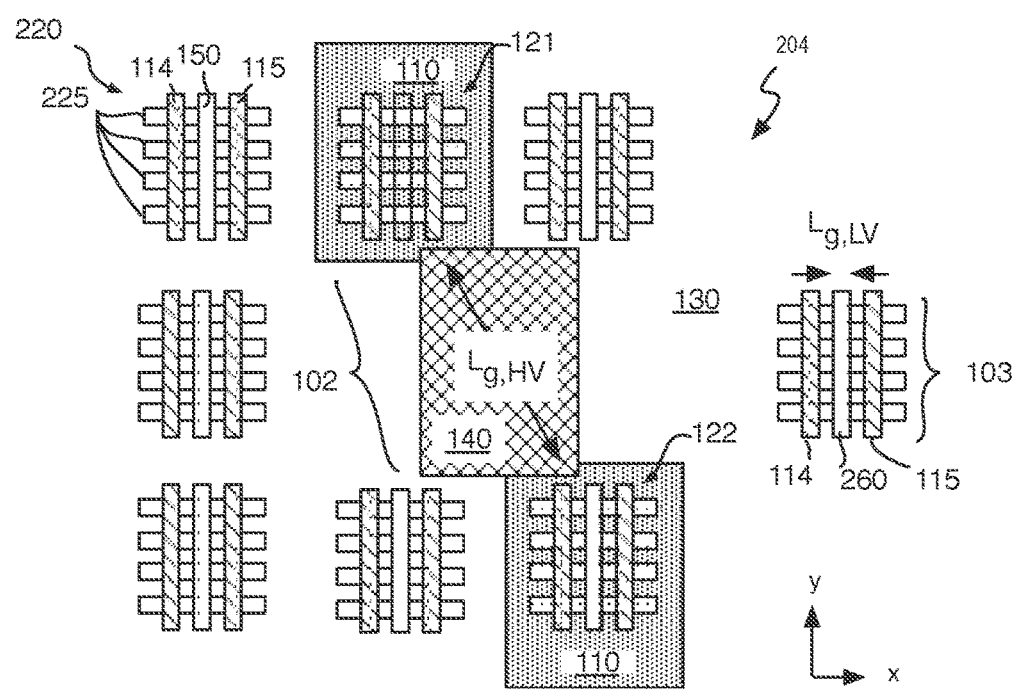

FIG. 2D illustrates an IC structure 204 where doped wells 110 are not aligned in either planar dimension (x or y) and high voltage FET 102 has a gate length $L_{g,HV}$ in a direction non-parallel to both the longest lengths of semiconductor bodies 225 and a width of gate stack 260. In this exemplary embodiment, a high voltage gate length $L_{g,HV}$ may be achieved for a given pitch in the array of finFET gangs 220.

Figure 3:
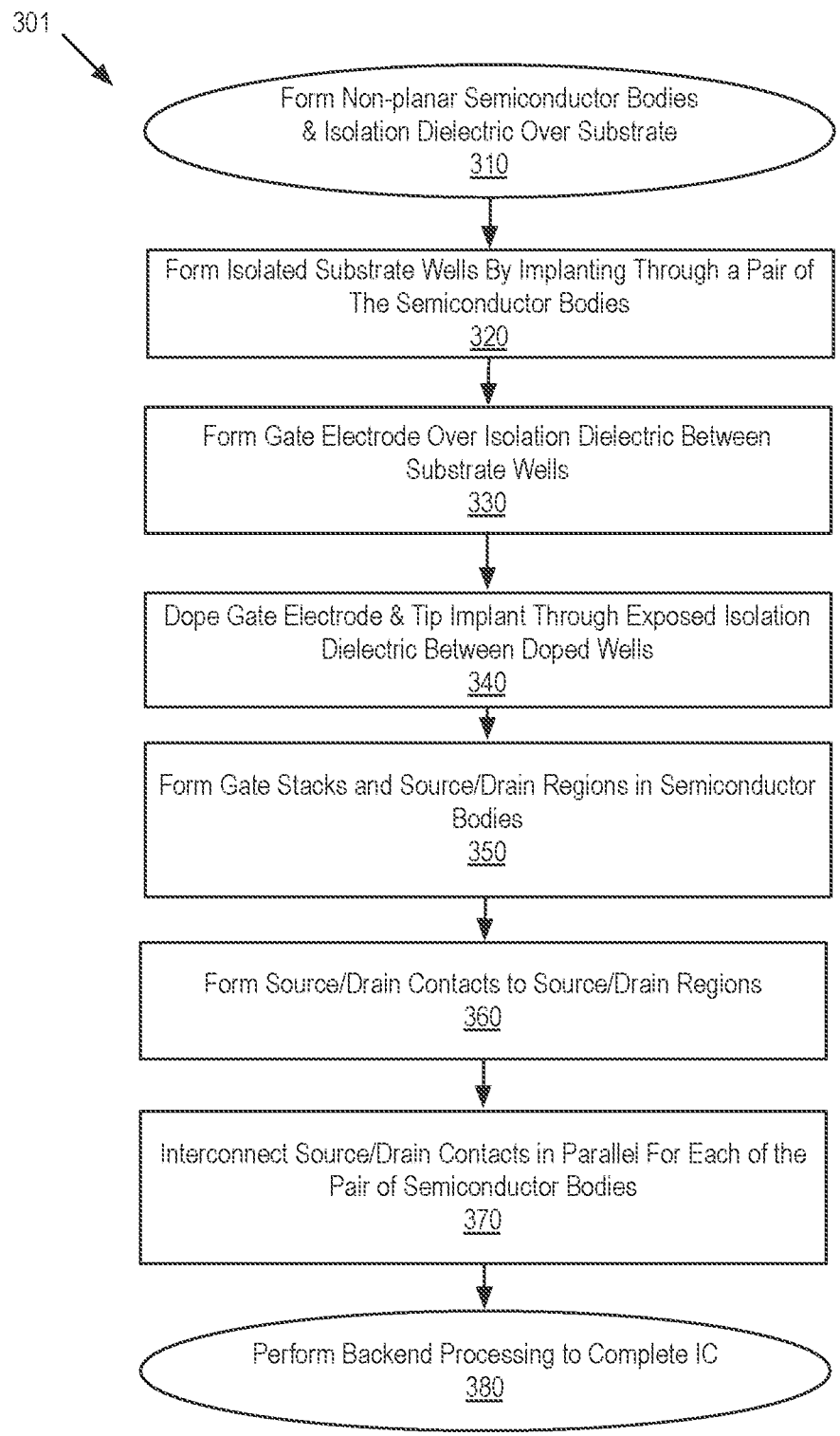
FIG. 3 is a flow diagram illustrating a method of forming a high voltage transistor and a finFET, in accordance with an embodiment.

High voltage FETs and IC structures incorporating them along with finFETs may be fabricated with a wide variety of techniques. FIG. 3 is a flow diagram illustrating a method 301 for forming an IC structure including both a high voltage FET and a finFET, in accordance with one exemplary embodiment. Unless specifically noted, the order of operations presented in method 301 is unimportant as one of ordinary skill may modify operation sequencing. Method 301 may be practiced to fabricate IC structure 101 illustrated in FIG. 1A-1C, and/or IC structures 201, 202, 203, or 204 illustrated in FIG. 2A-2D, for example. Certain operations described in the context of method 301 are described in further detail in reference to FIG. 4A-4E, which are cross-sectional views of a high voltage FET and a finFET evolving as selected operations in method 301 are performed, in accordance with advantageous embodiments. Reference numbers introduced in FIGS. 1A, 1B, 1C, 2A, 2B, 2C, 2D are retained for corresponding structures illustrated in FIG. 4A-4E.

Method 301 begins at operation 310 where non-planar semiconductor bodies and a surrounding isolation dielectric are formed over a substrate. Each non-planar body may be a "fin" etched into a planar surface of the substrate. The semiconductor body and substrate may be, for example, substantially monocrystalline silicon, or any other semiconductor material system suitable for formation of a transistor, such as any of those described above. Isolation dielectric may, for example, be deposited over the non-planar semiconductor bodies, planarized with a top surface of non-planar semiconductor bodies, and then recessed using conventional techniques to expose a desired fin z-height. In the example illustrated in FIG. 4A, non-planar semiconductor bodies 121 and 122 extend from substrate 105 with isolation dielectric 130 disposed over an intervening length of substrate 105. A third non-planar semiconductor body 123 extends from substrate 105 and is also separated by a length of substrate 105 covered by isolation dielectric 130.

At operation 320, isolated doped wells may be formed in the substrate. In the exemplary embodiment, doped wells are formed by implanting through at least a pair of non-planar semiconductor bodies. The well impurity species may also be implanted through a portion the isolation dielectric extending between the pair of semiconductor bodies. Alternatively, well doping may be performed prior to the formation of non-planar semiconductor bodies and/or isolation dielectric (i.e., sequence of operations 310 and 320 reversed). Any doping process known to be suitable to provide a desired well doping profile(s) may be utilized. For example, one or more ion implant processes may be performed at operation 310. In the example illustrated in FIG. 4B, semiconductor bodies 121, 122 are doped by implanting an impurity of a type complementary to the conductivity type of substrate 105. During implantation, portions of substrate 105 surrounding semiconductor bodies 121, 122 are masked to delineate isolated wells. A mask may further protect semiconductor body 123, and a surrounding portion of substrate 105, during the well implantation process.

Returning to FIG. 3, at operation 330 a gate electrode is formed over the isolation dielectric in the region between the pair of doped wells. To form the gate electrode, a material, such as, but not limited to, polysilicon is deposited over the isolation dielectric and patterned to form one or more gate electrode features in alignment with the doped wells. Any suitable deposition technique may be utilized, such as, but not limited to chemical vapor deposition (CVD), or atomic layer deposition (ALD). In one exemplary embodiment, polysilicon is deposited by CVD. Any suitably anisotropic etch may be utilized to pattern the gate electrode material. In the exemplary embodiment illustrated in FIG. 4C, gate electrode 140 is formed over isolation 130 along with sacrificial gate stacks 440, which are precursor structures in a finFET gate replacement process. In certain embodiments, along with the formation of gate electrode 140, a thin film resistor (not depicted) of the same material as gate electrode 140 may be concurrently formed with gate electrode 140.

Returning to FIG. 3, at operation 340 the gate electrode formed at operation 330 is doped. Either a p-type or an n-type doping process, or both doping processes for CMOS high voltage implementations, may be performed at operation 330. For embodiments where a thin film resistor was also formed along with the high voltage gate electrode at operation 330, the thin film resistor may also be doped at operation 340 to achieve a desired sheet resistance. Any known masking process and ion implantation process may be employed for the purpose of implanting the desired impurity species into at least the gate electrode. In a further embodiment, doping of the gate electrode may also concurrently form tip portions of the isolated doped wells by implanting an impurity of the same conductivity type as the doped wells through the isolation dielectric adjacent to the gate electrode. For example, in the exemplary embodiment illustrated in FIG. 4D, tip portions 111 occupy a portion of substrate 105 between edges of gate electrode 140 and doped wells 110. Tip portions 111 may be doped to a lower impurity concentration and/or lesser depth in substrate 105 than doped wells 110 to provide a graded junction that may mitigate a hot carrier effect and/or junction leakage associated with a high voltage FET. Doping of tip portions 111 and gate electrode 140 may be performed with at least non-planar semiconductor body 123 masked, maintaining electrical isolation and conductivity type of non-planar semiconductor body 123.

Figure 4A:
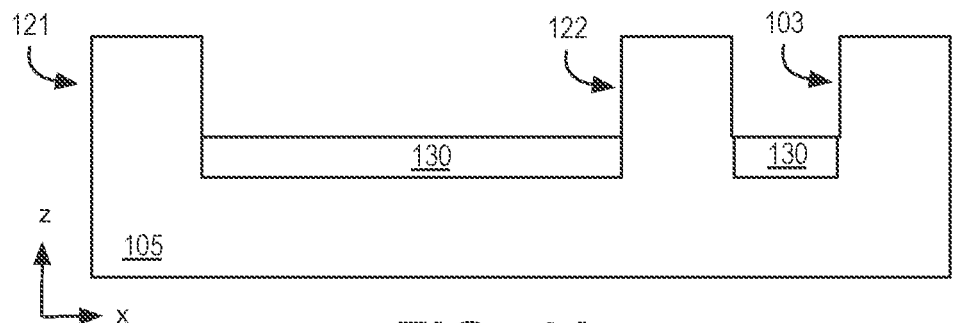
FIGS. 4A, 4B, 4C, 4D, and 4E are cross-sectional views of a high voltage transistor and a finFET evolving as selected operations in the method depicted in FIG. 3 are performed, in accordance with an embodiment.
Figure 4B:
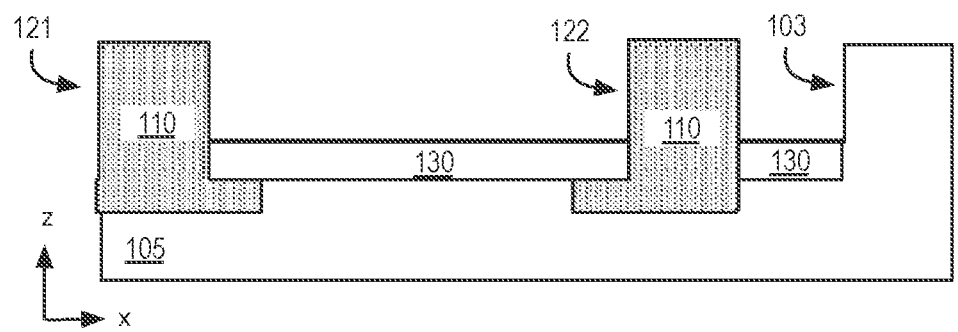
Figure 4C:
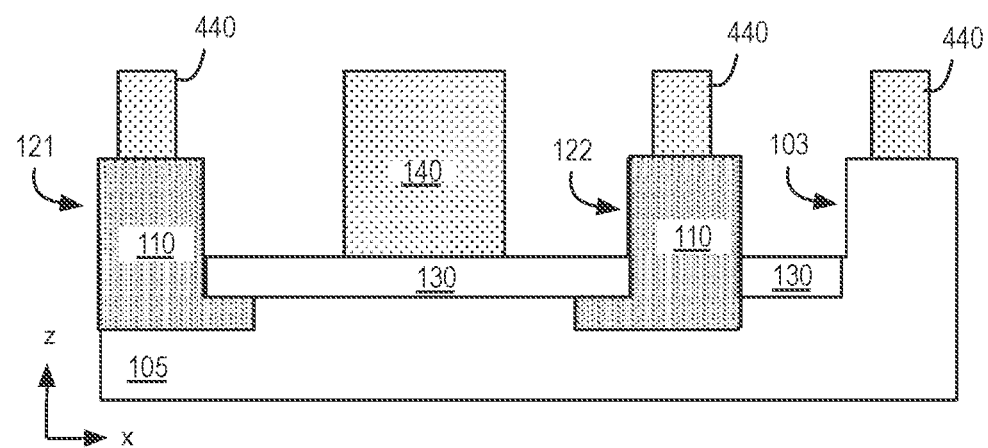
Figure 4D:
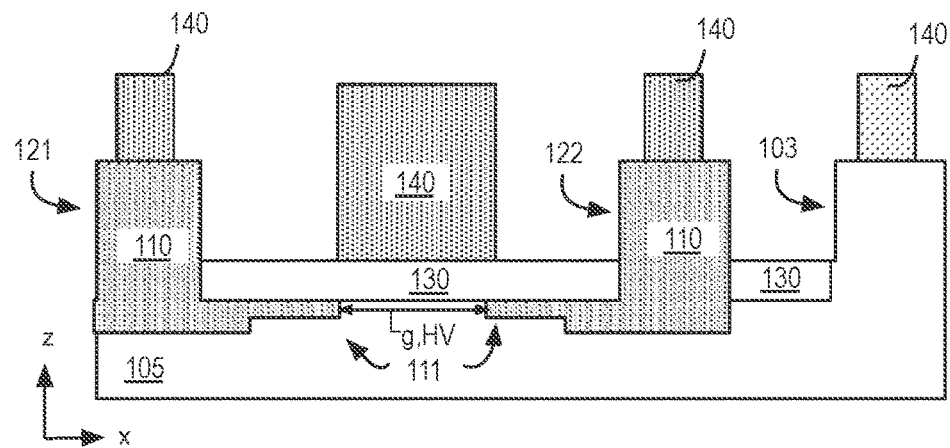
Figure 4E:
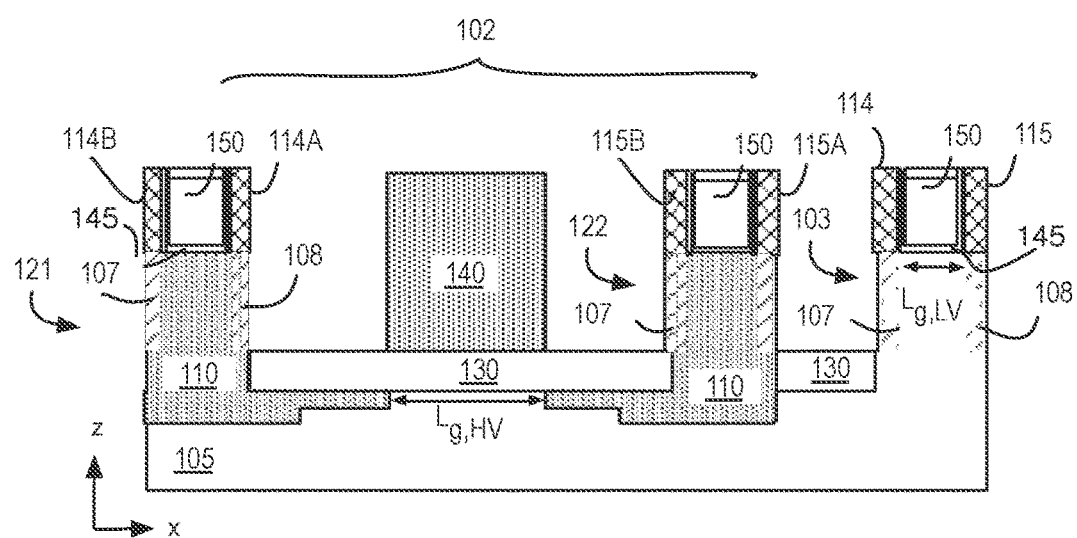

Returning to FIG. 3, at operation 350 gate stacks and source/drain regions are formed in the non-planar semiconductor bodies. Any technique known to be suitable for forming a gate stack over a finFET may be utilized at operation 350. Any technique known to be suitable for forming source/drain regions of a finFET may also be utilized at operation 350. In the exemplary embodiment illustrated in FIG. 4E, a gate replacement process is performed in which a sacrificial gate stack is replaced with a gate stack including a gate dielectric deposited over a semiconductor channel region and a gate electrode disposed over the gate dielectric. Any known etch process may be utilized to remove the sacrificial gate structures selectively to a surrounding dielectric, and selectively to gate electrode 140. For example, a mask may be utilized to protect gate electrode 140 (and any thin film resistor fabricated along with gate electrode 140) during removal of sacrificial gates. Over the channel region of semiconductor body 123, a finFET gate dielectric 145 is deposited, for example with a deposition process such as, but not limited to, ALD. This deposition may also form finFET gate dielectric 145 over a portion of semiconductor bodies 121 and 122. Over the finFET gate dielectric one or more finFET gate electrode material 150 may be deposited by any known technique, such as, but not limited to, physical vapor deposition (PVD), CVD, or ALD, depending on the material deposited. If the deposition process is not self-planarizing, a planarizing process, such as CMP may be performed to expose top surfaces of a surrounding dielectric (not depicted). As illustrated in FIG. 4E, in the exemplary embodiment the gate replacement process further forms dummy gate stacks over semiconductor bodies 121, 122 incorporated into high voltage FET 102. Source/drain regions 107/108 are also formed with any technique known to be suitable for finFETs, such as, but not limited to, implantation, raised source/drain semiconductor regrowth, and or embedded source/drain semiconductor etch and regrowth.

Returning to FIG. 3, method 301 continues at operation 360 with the formation of source/drain diffusion contacts to the source/drain regions formed at operation 350. Any contact metallization process known to be suitable for the composition of non-planar semiconductor bodies 121, 122, and 123 (e.g., provides good ohmic behavior) may be employed at operation 360. In the exemplary embodiment illustrated in FIG. 4E, diffusion contacts 114A and 114B are landed on semiconductor body 121. Diffusion contacts 115A, 115B are land on semiconductor body 122. Source diffusion contact 114 and drain diffusion contact 115 are landed on semiconductor body 123. In an advantageous embodiment, all of the diffusion contacts 114, 114A, 114B, 115, 115A, and 115B are formed concurrently (e.g., with a single masked etch) and with a same metal or metals.

Returning to FIG. 3, method 301 continues at operation 350 where source/drain diffusion contacts for each of the semiconductor bodies 121 and 122 are interconnected in electrical parallel. In the exemplary embodiment illustrated in FIG. 4A for example, diffusion contacts 114A, 114B may be interconnected in electrical parallel as two contacts to one transistor terminal coupled to a first well region 110. Likewise, diffusion contacts 115A, 115B may be interconnected in electrical parallel as two contacts to one transistor terminal coupled to a second well region 110. Source diffusion contact 114 and drain diffusion contact 115 may be interconnected as separate finFET terminals in any conventional interconnect arrangement.

Completing description of FIG. 3, method 301 the ends with completion of an IC at operation 380, for example with the performance of backend processing that interconnects terminals of a high voltage FETs with other high voltage FETs, and/or with finFETs, and/or with other circuit elements, such as resistors, etc.

Notably, the high voltage transistor architectures and techniques are amenable to forming high voltage (HV) CMOS circuitry enlisting a plurality of high voltage FETS comporting with one or more of the embodiments described above. For example, a first NMOS high voltage FET having a p-type channel region, n-type wells and n-type non-planar semiconductor bodies may be integrated into a circuit with a PMOS high voltage FET having an n-type channel region, p-type wells and p-type non-planar semiconductor bodies. One or more of these FETs may be further integrated with NMOS, PMOS, or CMOS finFETs.

Figure 5:
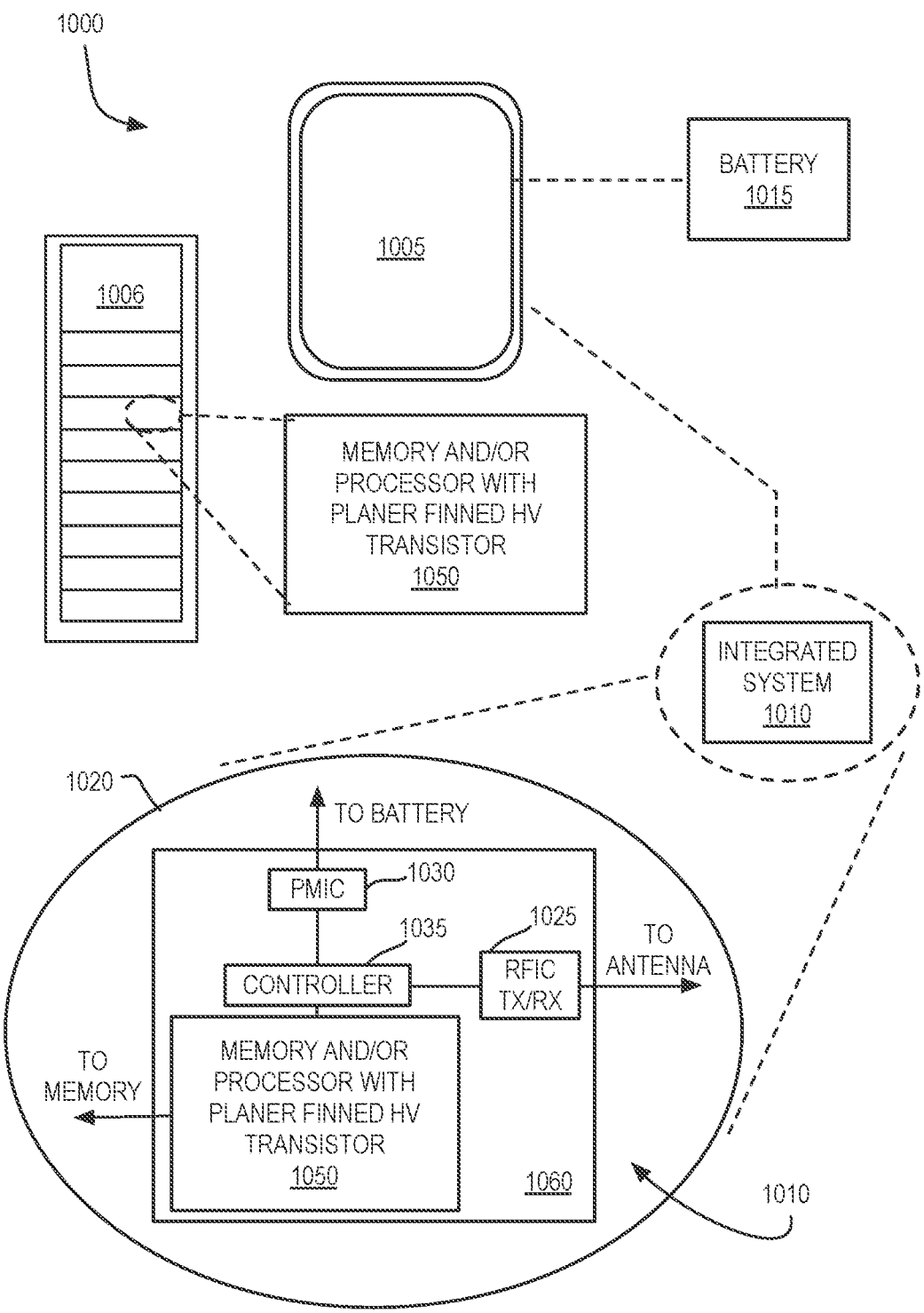
FIG. 5 illustrates a mobile computing platform and a data server machine employing an IC structure including a high voltage transistor and a finFET, in accordance with embodiments of the present invention.

FIG. 5 illustrates a system 1000 in which a mobile computing platform 1005 and/or a data server machine 1006 employs an IC structure including one or more high voltage FET in accordance with one or more embodiment of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a high voltage FET and a finFET, for example as describe elsewhere herein. The monolithic IC 1050 may be further coupled to a board, a substrate, or integrated into SoC 1060 along with, one or more of a power management integrated circuit (PMIC) 1030, RF (wireless) integrated circuit (RFIC)

1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply coupled to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single SOC IC coupled to the package substrate of the monolithic IC 1050. In particular embodiments, at least one of a processor IC, memory IC, RFIC, or PMIC includes circuitry that incorporates a high voltage FET having one or more of the structural features described elsewhere herein. In further embodiments, at least one of a processor IC, memory IC, RFIC, or PMIC includes circuitry that incorporates a high voltage FET and finFET having one or more of the structural features described elsewhere herein.

Figure 6:
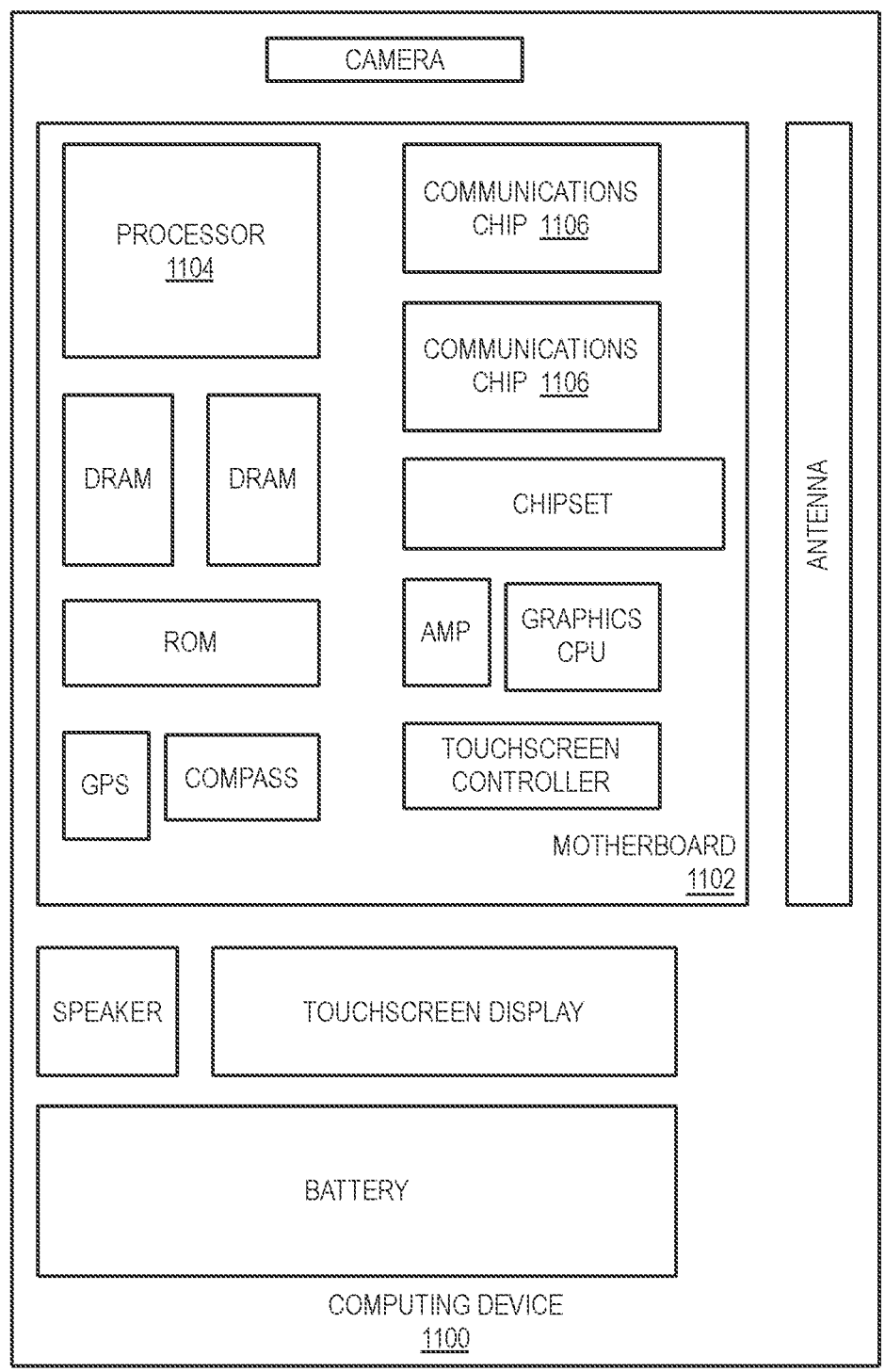
FIG. 6 is a functional block diagram of an electronic computing device, in accordance with an embodiment of the present invention.

FIG. 6 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate a high voltage FET, in accordance with one or more embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and the like.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one of more first embodiments, an integrated circuit (IC) structure comprises a high voltage FET disposed over a first region of the substrate, wherein the high voltage FET includes a pair of non-planar semiconductor bodies, each of the bodies extending from a doped well in the substrate, and with a channel region between the pair of non-planar semiconductor bodies and separating the doped wells. The high voltage FET includes a source region in a first of the non-planar semiconductor bodies. The high voltage FET includes a drain region in a second of the non-planar semiconductor bodies. The high voltage FET includes a gate stack disposed over a channel region.

In furtherance of the first embodiment, the IC structure further comprises a non-planar FET disposed over a second region of the substrate. The non-planar FET includes a third non-planar semiconductor body. The non-planar FET includes a second source region and a second drain region disposed within the third non-planar semiconductor body and separated by a second channel region within the third semiconductor body. The non-planar FET includes a second gate stack disposed over the second channel region.

In furtherance of the embodiment immediately above, the high voltage FET further comprises a pair of dummy gate stacks. A first dummy gate stack disposed over a first of the semiconductor bodies and a second dummy gate stack disposed over a second of the semiconductor bodies. Each of the dummy gate stacks comprises substantially the same materials as the short-channel gate stack.

In furtherance of the embodiment above, the source region is one of a pair of heavily doped regions in a first of the pair of non-planar semiconductor bodies. The drain region is one of a pair of heavily doped regions in a second of the pair of non-planar semiconductor bodies. The short-channel and high voltage FET further comprises diffusion contacts, one of the diffusion contacts landing on each of the heavily doped regions, the second source region, and the second drain region.

In furtherance of the first embodiment, the channel region is planar portion of the substrate, and the gate stack further comprises an isolation dielectric that is disposed over the channel region and further surrounds the pair of non-planar semiconductor bodies.

In furtherance of the embodiment immediately above, the gate stack comprises a doped polysilicon electrode disposed over the isolation dielectric. The second gate stack comprises a metal electrode and a gate dielectric having an equivalent oxide thickness (EOT) that is lower than that of the isolation dielectric.

In furtherance of the first embodiment, the doped wells are of a first conductivity type complementary to that of the channel region. A first of the pair of non-planar semiconductor bodies is doped to the first conductivity type and is electrically connected to a first of the doped wells. A second of the pair of non-planar semiconductor bodies is doped to the first conductivity type and is electrically connected to a second of the doped wells.

In furtherance of the first embodiment, the source region is one of a pair of heavily doped regions in a first of the pair of non-planar semiconductor bodies. The drain region is one of a pair of heavily doped regions in a second of the pair of non-planar semiconductor bodies. The high voltage FET further comprises diffusion contacts, one of the diffusion contacts landing on each of the heavily doped regions.

In furtherance of the first embodiment, the high voltage FET further comprises a pair of dummy gate stacks, a first dummy gate stack disposed over a first of the semiconductor bodies and a second dummy gate stack disposed over a second of the semiconductor bodies.

In one or more second embodiments, an integrated circuit (IC) structure comprises a plurality of non-planar semiconductor bodies in a arrayed over a substrate, wherein the non-planar semiconductor bodies are oriented in parallel with their longest lengths extending along a first dimension. The IC structure further comprises a pair of doped wells disposed in the substrate, the wells encompassing a pair of the semiconductor bodies and aligned with each other along either the first or a second dimension, orthogonal to the first dimension. The IC structure further comprises an isolation dielectric disposed over the doped wells and surrounding the plurality of non-planar semiconductor bodies. The IC structure further comprises a gate electrode disposed over the isolation dielectric between the pair of doped wells, the gate electrode defining a gate length ($L_g$) in the first dimension if the wells are aligned in the second dimension and defining the $L_g$ in the second dimension if the wells are aligned in the first dimension. The IC structure further comprises a source region in a first of the pair of semiconductor bodies, and a drain region in a second of the pair of semiconductor bodies.

In furtherance of the second embodiment, the IC structure further comprises a third of the non-planar semiconductor bodies disposed in a region of the substrate outside of the pair of doped wells. The IC structure further comprises a second gate electrode disposed over the third non-planar semiconductor body. The IC structure further comprises a second source and drain contact landing on the third non-planar semiconductor body.

In furtherance of the second embodiment, each of the plurality of semiconductor bodies arrayed over the substrate is one in a gang of semiconductor bodes spaced apart over a first width of the substrate extending in the second dimension. The pair of doped wells extend over at least the first width and are aligned with each other in the first dimension. The gate electrode length $L_g$ in the second dimension is at least equal to the first width.

In furtherance of the second embodiment, each of the plurality of semiconductor bodies arrayed over the substrate is one in a gang of semiconductor bodes spaced apart over a first width of the substrate extending in the second dimension. The pair of doped wells extend over at least the first width and are aligned with each other in the second dimension. The gate electrode length $L_g$ in the second dimension is less than, or equal to, the longest lengths of the semiconductor bodies.

In one or more third embodiment, a method of fabricating a high voltage field effect transistor (FET) over a first portion of a substrate comprises forming non-planar semiconductor bodies extending over a surrounding isolation dielectric over a substrate. The method further comprises forming separate doped wells in the substrate by implanting through a pair of the semiconductor bodies. The method further comprises depositing a gate electrode over the isolation dielectric between the doped wells. The method further comprises forming source/drain regions in the pair of semiconductor bodies that are electrically coupled to the doped wells. The method further comprises forming diffusion contacts to the source/drain regions.

In furtherance of the embodiment immediately above, the method further comprises forming a non-planar FET in a second region over a second portion of the substrate. The forming of the non-planar FET further comprises forming a gate stack over one or more of the non-planar semiconductor bodies outside of the doped wells. The forming of the non-planar FET further comprises forming second source/drain regions in the one or more non-planar semiconductor body outside of the doped wells. The forming of the non-planar FET further comprises forming second diffusion contacts to the second source/drain regions.

In furtherance of the embodiment above, the method further comprise doping the gate electrode and forming tip portions of the isolated doped wells by implanting an impurity of the same conductivity type as the doped wells into the gate electrode and through the isolation dielectric adjacent to the gate electrode.

In furtherance of the embodiment above, forming the source/drain regions further comprises forming a first pair of source/drain regions in a first of the pair of semiconductor bodies and a second pair of source/drain regions in a second of the pair of semiconductor bodies. Forming the diffusion contacts further comprises forming a first pair of source/drain contacts to the first pair of source/drain regions and a second pair of diffusion contacts to the second pair of source/drain regions. The method further comprises interconnecting the first pair of diffusion contacts in electrical parallel and interconnecting the second pair of diffusion contacts in electrical parallel.

In furtherance of the method above, forming the forming a gate stack over one or more of the non-planar semiconductor bodies outside of the doped wells further comprises forming a dummy gate stack over each of the pair of semiconductor bodies that are electrically coupled to the doped wells.

In one or more fourth embodiment, a system on a chip (SoC), comprises processor logic circuitry. The SoC comprises memory circuitry coupled to the processor logic circuitry. The SoC comprises RF circuitry coupled to the processor logic circuitry and including radio transmission circuitry and radio receiver circuitry. The SoC comprises power management circuitry including an input to receive a DC power supply and an output coupled to at least one of the processor logic circuitry, memory circuitry, or RF circuitry. At least one of the RF circuitry or power management circuitry includes an extended drain field effect transistor (FET), further comprising the integrated circuit (IC) structure of any one of the embodiments above.

In one or more fifth embodiment, a system on a chip (SoC), comprises processor logic circuitry. The SoC comprises memory circuitry coupled to the processor logic circuitry. The SoC comprises RF circuitry coupled to the processor logic circuitry and including radio transmission circuitry and radio receiver circuitry. The SoC comprises power management circuitry including an input to receive a DC power supply and an output coupled to at least one of the processor logic circuitry, memory circuitry, or RF circuitry. At least one of the RF circuitry or power management circuitry includes a high voltage FET disposed over a first region of the substrate. The high voltage FET further includes a pair of non-planar semiconductor bodies, each extending from a doped well in the substrate with a channel region between the pair of non-planar semiconductor bodies and separating the doped wells. The high voltage FET further includes a source region in a first of the non-planar semiconductor bodies. The high voltage FET further includes a drain region in a second of the non-planar semiconductor bodies. The high voltage FET further includes a gate stack disposed over a channel region.

In furtherance of the fifth embodiment, at least one of the RF circuitry or power management circuitry includes a non-planar FET disposed over a second region of the substrate. The non-planar FET further includes a third non-planar semiconductor body. The non-planar FET further includes a second source region and a second drain region disposed within the third non-planar semiconductor body and separated by a second channel region. The non-planar FET further includes a second gate stack disposed over the second channel region.

In furtherance of the embodiment immediately above, the source region is one of a pair of heavily doped regions in a first of the pair of non-planar semiconductor bodies. The drain region is one of a pair of heavily doped regions in a second of the pair of non-planar semiconductor bodies. The short-channel and high voltage FET further comprises diffusion contacts, one of the diffusion contacts landing on each of the heavily doped regions, the second source region, and the second drain region.

In furtherance of the first embodiment, the pair of non-planar semiconductor bodies is in a larger plurality of non-planar semiconductor bodies arrayed over the substrate, the non-planar semiconductor bodies oriented in parallel with their longest lengths extending along a first dimension. The doped wells encompass the pair of the semiconductor bodies and are aligned with each other along either the first or a second dimension, orthogonal to the first dimension. The gate electrode defines a gate length ($L_g$) in the first dimension if the doped wells are aligned in the second dimension and defining the $L_g$ in the second dimension if the wells are aligned in the first dimension.

In furtherance of the embodiment immediately above, each of the plurality of semiconductor bodies arrayed over the substrate is one in a gang of semiconductor bodes, each gang spaced apart over a first width of the substrate extending in the second dimension. The pair of doped wells extend over at least the first width and are aligned with each other in the first dimension. The gate electrode length $L_g$ in the second dimension is at least equal to the first width.

In furtherance of the embodiment above, each of the plurality of semiconductor bodies arrayed over the substrate is one in a gang of semiconductor bodes, each gang spaced apart over a first width of the substrate extending in the second dimension. The pair of doped wells extend over at least the first width and are aligned with each other in the second dimension. The gate electrode length $L_g$ in the second dimension is less than, or equal to, the longest lengths of the semiconductor bodies.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
  a plurality of non-planar bodies, each comprising semiconductor;
  a first field effect transistor (FET) over a first region of a substrate layer, wherein the FET includes:
    a first and a second of the non-planar bodies the first and second bodies extending from well portions of the substrate layer that comprise an impurity dopant;
    a first channel region between the first and second bodies, and between the well portions;
    a first source region and a second source region in the first of the non-planar bodies;
    a first drain region and a second drain region in the second of the non-planar bodies; and
    a first gate stack over the first channel region; and
  a second FET over a second region of the substrate layer, wherein the second FET includes:
    a third of the non-planar bodies;
    a third source region in the third of the non-planar bodies;
    a third drain region in the third of the non-planar bodies;
    a second channel region in the third of the non-planar bodies, the second channel region between the third source region and the third drain region; and
    a second gate stack over the second channel region.

2. The IC structure of claim 1, wherein:
  the first channel region comprises a planar portion of the substrate layer; and
  the first gate stack further comprises a dielectric material that is over the channel region and is between the first and second non-planar bodies.

3. The IC structure of claim 2, wherein:
  the first gate stack comprises a polysilicon electrode over the dielectric material; and
  the second gate stack comprises a metal electrode and a second dielectric material having an equivalent oxide thickness (EOT) that is lower than that of the first dielectric material.

4. The IC structure of claim 1, wherein:
  the well regions are of a first conductivity type complementary to that of the channel region;
  the first of the non-planar bodies has the first conductivity type and is electrically connected to a first of the well regions; and
  the second of the non-planar bodies has the first conductivity type and is electrically connected to a second of the well regions.

5. The IC structure of claim 1, wherein:

the first FET further comprises a pair of dummy gate stacks, a first dummy gate stack over the first of the bodies and a second dummy gate stack over the second of the bodies.

6. The IC structure of claim 1, wherein:

the first FET further comprises a pair of dummy gate stacks, a first dummy gate stack over the first of the bodies and a second dummy gate stack over the second of the bodies, wherein each of the dummy gate stacks comprises substantially the same materials as the second gate stack.

7. The IC structure of claim 1, wherein:

the first FET and the second FET each further comprises diffusion contacts, individual ones of the diffusion contacts landing on individual ones of the first and second source regions, and the first and second drain regions.

8. A system on a chip (SoC), comprising:

processor logic circuitry;

memory circuitry coupled to the processor logic circuitry;

RF circuitry coupled to the processor logic circuitry and including radio transmission circuitry and radio receiver circuitry; and power management circuitry including an input to receive a DC power supply and an output coupled to at least one of the processor logic circuitry, memory circuitry, or RF circuitry, wherein at least one of the RF circuitry or power management circuitry includes the first FET and second FET of claim 1.

9. The SoC of claim 8, wherein:

the first FET and the second FET further comprises contacts, individual ones of the contacts landing on individual ones of the first and second source regions and the first and second drain regions.

10. A computer platform comprising:

the SOC of claim 8; and a power supply coupled to the SOC.

* * * * *